United States Patent [19]
Batchelder et al.

[11] Patent Number: 5,766,824
[45] Date of Patent: Jun. 16, 1998

[54] METHOD AND APPARATUS FOR CURING PHOTORESIST

[75] Inventors: William T. Batchelder, San Mateo; Michael L. Parodi, Alamo; Michael R. Biche, Union City, all of Calif.

[73] Assignee: Semiconductor Systems, Inc., Fremont, Calif.

[21] Appl. No.: 508,028

[22] Filed: Jul. 27, 1995

Related U.S. Application Data

[63] Continuation-in-part of Ser. No. 152,037, Nov. 12, 1993, Continuation-in-part of Ser. No. 412,650, Mar. 29, 1995, which is a continuation of Ser. No. 93,505, Jul. 16, 1993, abandoned.

[51] Int. Cl.$^6$ .................................................. G03F 7/00
[52] U.S. Cl. .............................. 430/330; 430/327; 134/21
[58] Field of Search ........................... 430/311, 322, 430/327, 330; 134/21

[56] References Cited

U.S. PATENT DOCUMENTS

| 762,888 | 6/1904 | Decker . | |
|---|---|---|---|
| 2,165,122 | 7/1939 | Ashberry | 312/20 |
| 3,788,719 | 1/1974 | Whited | 312/198 |
| 3,854,605 | 12/1974 | Proper et al. | 214/16.4 A |
| 4,744,715 | 5/1988 | Kawabata | 414/331 |
| 4,842,683 | 6/1989 | Cheng et al. | 156/345 |
| 4,935,320 | 6/1990 | Rohde et al. | 430/14 |
| 4,951,601 | 8/1990 | Maydan et al. | 118/719 |
| 4,985,722 | 1/1991 | Ushijima et al. | 354/319 |
| 5,048,164 | 9/1991 | Harima | 29/25.01 |
| 5,061,144 | 10/1991 | Akimoto et al. | 414/225 |
| 5,135,608 | 8/1992 | Okutani | 156/643 |
| 5,171,393 | 12/1992 | Moffat | 156/345 |
| 5,202,716 | 4/1993 | Tateyama et al. | 354/319 |

FOREIGN PATENT DOCUMENTS

| 0253 162 A2 | 6/1987 | European Pat. Off. | B65G 47/91 |
|---|---|---|---|
| 0462 459 A1 | 6/1991 | European Pat. Off. | H01L 21/00 |
| 0435 568 A3 | 7/1991 | European Pat. Off. | B05B 13/00 |
| 922144 | 12/1945 | France | 312/327 |
| WO91/19316 | 12/1991 | WIPO | H01L 21/312 |

OTHER PUBLICATIONS

Korolkoff, Nicholas O., "Integrated Processing Part II—Cluster Tool Systems", *Solid State Technology*, vol. 33, No. 10, Oct. 1990, pp. 82–90.

Lovell, Anthony M., et al., "Cell Automation; Integrating Manufacturing With Robotics", *Solid State Technology*, vol. 33, No. 12, Dec. 1990, pp. 37–39.

*Primary Examiner*—Kathleen Duda
*Attorney, Agent, or Firm*—Skjerven, Morrill, MacPherson Franklin & Friel LLP; David E. Steuber

[57] ABSTRACT

A substrate photolithography system includes a substrate handling robot that pivots about a fixed point and transfers substrates between photoresist coater, a developer, and a heating/cooling unit, all of which are clustered about the robot. The end effector of the robot is capable of both vertical and lateral movement so that individual modules of the heating/cooling unit may be stacked. For heating/cooling, the substrate is placed in the heating/cooling unit in close proximity to a hotplate/chillplate and a thermally conductive, non-reactive gas, such as helium, is introduced into the airspace between the substrate and the hotplate/chillplate. The thermally conductive, non-reactive gas, is preheated/precooled before introduction into the airspace between the substrate and the hotplate/chillplate when the gas passes through a bore in the hotplate/chillplate. Additionally, the substrate is automatically aligned in a milled recession in the hotplate surface for future handling.

16 Claims, 13 Drawing Sheets

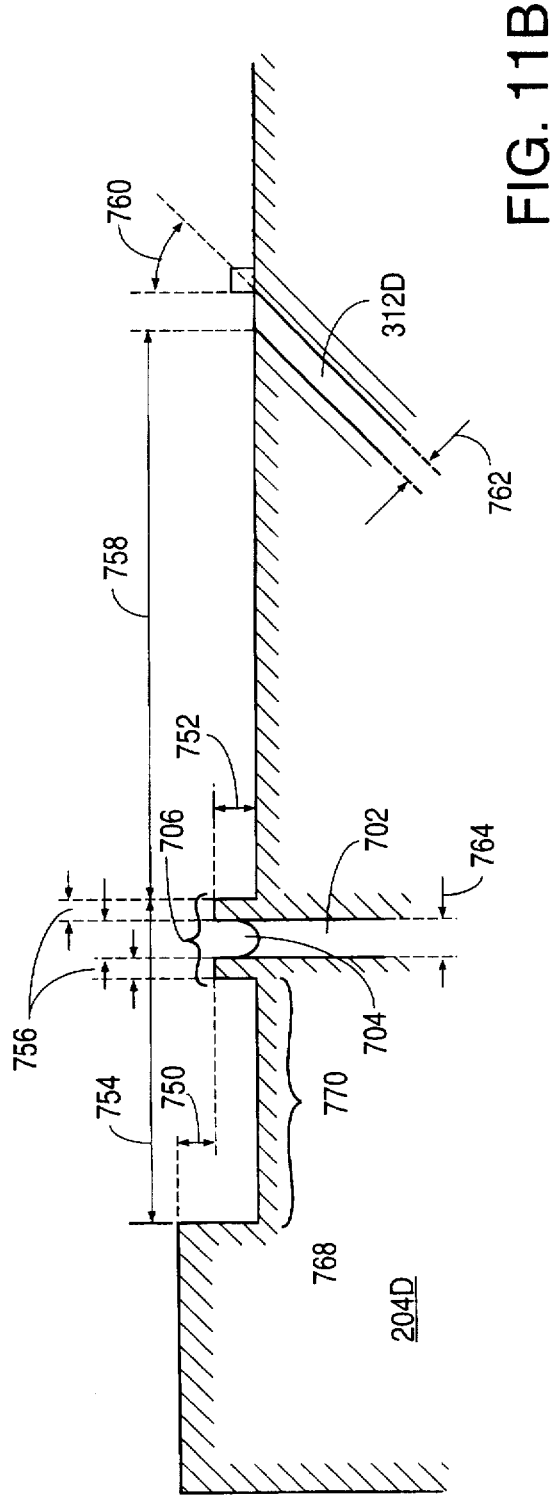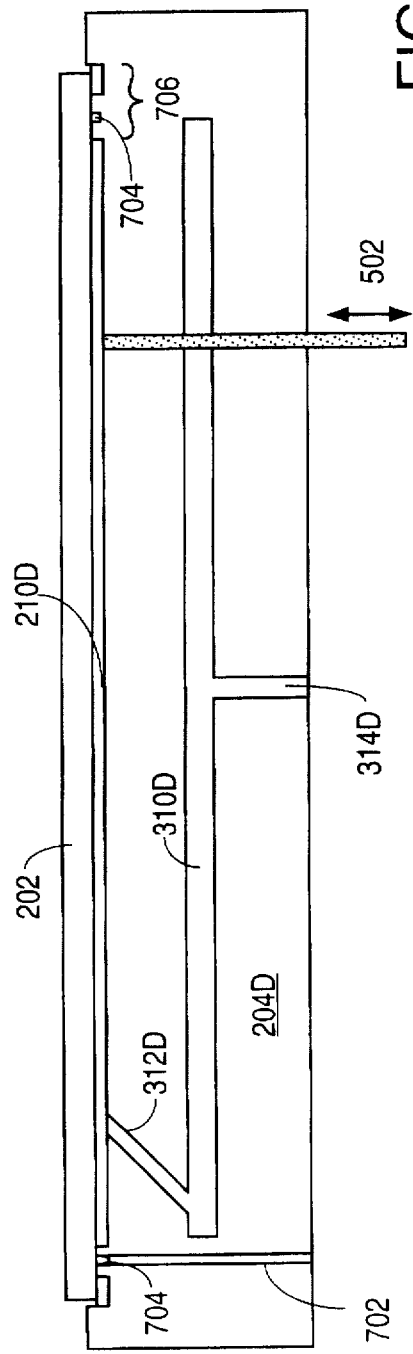

METHOD AND APPARATUS FOR CURING PHOTORESIST

CROSS REFERENCES TO RELATED APPLICATIONS

The present application is a continuation-in-part of both the U.S. patent application entitled "Method and Apparatus for Baking and Cooling Semiconductor Wafers and the Like," application Ser. No. 08/152,037, filed Nov. 12, 1993, and the U.S. patent application entitled "Clustered Photolithography System," application Ser. No. 08/412,650, filed Mar. 29, 1995, which is a continuation of the U.S. patent application entitled "Clustered Semiconductor Wafer Photolithography System," application Ser. No. 08/093,505, filed Jul. 16, 1993, now abandoned.

In addition, the assignee of the present application owns co-pending and related patent applications:

1. Ser. No. 08/093,250, filed Jul. 16, 1993, entitled "Thermal Process Module For Substrate Coat/Develop System," abandoned; and
2. Ser. No. 08/092,842, filed Jul. 16, 1993, entitled "Cassette Input/Output Unit For Semiconductor Processing System," now U.S. Pat. No. 5,443,348

The foregoing documents are all incorporated herein by this reference.

FIELD OF THE INVENTION

This invention relates to photolithography systems and, in particular, to a system for handling substrates in the course of applying a layer of a liquid material, such as photoresist, polyimide or spun on glass, and developing the layer to form a mask on the surface of the substrate.

BACKGROUND OF THE INVENTION

The process by which a photoresist mask is formed on a semiconductor wafer involves first coating the wafer with a thin layer of photoresist and then exposing the photoresist with the desired pattern. The photoresist layer is then developed. This involves a number of heating and cooling steps. In a typical process, the clean wafer is subjected to a dehydration bake at 100°–150° C. to remove any moisture that has accumulated and thereby promote the adhesion of photoresist to the wafer. In addition, a chemical such as hexamethyldisilazane (HMDS) may be used to improve adhesion between the photoresist and the wafer. A thin layer of photoresist is then applied to the wafer by spinning. The wafer is subjected to a "soft" bake at 90°–120° C. to create a firm bond with the photoresist and dry the photoresist by driving off any photoresist solvents. The wafer can then be transferred to the exposure system.

After the photoresist has been exposed, the wafer is subjected to a post-exposure bake at 60°–120° C. to solidify the pattern, and the photoresist is then developed, forming a pattern on the surface of the wafer. Following the developing step, the wafer is often subjected to a "hard" bake at 130°–160° C. to cross link the resist, thereby increasing the etch resistance of the photoresist and the adhesion of the photoresist to the silicon surface. After each of the foregoing baking steps, the wafer is cooled to 18°–25° C. to assure a uniform process.

All of these steps must be performed in a clean room that is temperature and humidity controlled and substantially free of dust and other particulate matter. At present, the most common system for performing this process uses a track to transport the wafer to successive stages of the process. Track systems have limited flexibility, because the wafers are locked in a fixed order. In a less common type of arrangement, various processing modules are positioned on either side of a central track, and the wafers are transported from module to module by a robot that moves back and forth along the central track. Such an arrangement is extremely wasteful of floor area because no processing occurs in the central track area. In addition, the throughput of this arrangement is limited by the speed with which the robot can move from one end of the system to the other.

Another throughput (i.e., speed) limitation is imposed by the time required to heat and cool wafers. In the prior art, hotplates were used to bake wafers. For example, a wafer that was coated on one side with a chemical, such as photoresist, was placed on a hotplate such that the uncoated side of the wafer was in direct contact with the hotplate. The wafer was held in position by applying a vacuum to the underside of the wafer through bores drilled into the hotplate. The hotplate was then heated to 100° C. to bake the wafer, bringing the wafer up to 100° C. in as little as five seconds.

Prior art baking systems that employ direct contact between the wafer and the hotplate are problematic for several reasons. First, in cases where higher temperatures are used, sudden contact of the heated hotplate with the relatively cool wafer can cause thermal shock, which sometimes leads to warping or fracturing of the wafer.

Second, contamination is easily transferred between the uncoated side, i.e., the "backside," of the wafer and the hotplate. When, as is often the case, the backside of a wafer is contaminated, the hotplate, being in direct contact with the contaminated wafer, likewise becomes contaminated. The contaminated hotplate may then transfer this contamination to the backsides of subsequent wafers. Such backside contamination of wafers can cause focus errors during the resist exposure process. Therefore, to combat the contamination, the hotplate would require frequent cleaning, requiring frequent breaks in the semiconductor manufacturing process.

For these reasons, semiconductor manufacturing has moved towards a "proximity bake," in which the wafer is spaced from the hotplate by three support posts, so as to leave a 5 mil gap between the wafer and the hotplate. This prevents backside contamination by avoiding direct contact between the backside of the wafer and the hotplate. Prevention of backside contamination reduces the likelihood of focus errors and thermal shock.

Unfortunately, two problems are presented by previously known proximity bake systems. First, the support posts that support the wafer above the hotplate interfere with the baking process by causing uneven baking at the points on the wafer that are in contact with support posts. Second, considerably more time is required to heat the wafer to the desired temperature. For example, forty-five (45) seconds is typically required to bring a wafer to 100° C. when spaced 5 mils from a hotplate at 100° C. In addition, convection can cause uneven heating at the wafer edge as the air between the wafer and the hotplate expands as a result of the heating of the air.

One known solution to the problem of the additional required bake time in proximity baking is to heat the hotplate to a higher temperature, e.g., 150° C. This hotter temperature brings the wafer to the desired temperature, e.g., 100° C., much more quickly. However, the thermal uniformity of the hotplate degrades as the temperature is increased. In addition, true thermal equilibrium is never fully attained in a reasonable process time. As a result, the temperature throughout the wafer is less uniform and changes throughout the baking process. In other words, some parts of the wafer are too cold and other parts of the wafer are too hot to properly effectuate an even cure of the chemical coating.

The substantial increase in bake time associated with proximity bake processes is particularly undesirable as increased bake time reduces the number of semiconductor wafers or other substrates that can be produced in a given time period, e.g. one day. Similarly, delays and resist exposure errors, which are caused by chemical contamination of the hotplate or the backside of the wafer, associated with contact baking of the prior art described above substantially reduce the number of semiconductor wafers that can be produced in a given time period and can reduce useful product yield.

A third problem arises during proximity baking of wafers if the wafer being baked has a slight warp. Some portions of the wafer are spaced further from the hotplate than other portions as a result of the warp of the wafer. Accordingly, those portions of the wafer further from the hotplate heat more slowly than the portions of the wafer nearer to the hotplate. Thus, warped wafers are not uniformly heated by proximity bake systems of the prior art.

The problems described above are equally applicable to the process by which the wafer is cooled for subsequent exposure of the photoresist. Typically, the wafer is placed on a chillplate that absorbs heat from the wafer and quickly brings the temperature of the wafer to room temperature. However, placing the wafer directly on the chillplate poses the same potential of backside contamination of the wafer described above with respect to hotplates. To prevent backside contamination, a proximity chill is used in which the wafer is supported by a number of support posts above a chillplate. Proximity chill suffers from the same slowness of heat transfer as described above with respect to proximity bake methods.

Due to the aforementioned limitations of conventional track photolithography systems and conventional wafer heating and cooling apparatuses, there is a need for a faster, more space-efficient photolithography system.

SUMMARY

In a photolithography system in accordance with the present invention, a wafer handling robot is mounted in a fixed position and is surrounded by a cluster of wafer processing modules, including a heating/cooling unit. The robot pivots about a fixed point and is capable of transporting the wafers laterally, in any direction, and vertically (i.e., in three degrees of freedom). This arrangement increases the flexibility of the system because each wafer can be moved to or from a module without waiting for the processing of another wafer to be completed. Moveover, because the robot is capable of transporting the wafers vertically, the modules may be stacked one above the other, thereby minimizing the floor area occupied by the system.

In the heating/cooling unit, the disadvantages of the contact bake systems and the proximity bake of the prior art are overcome by introducing a thermally conductive, nonreactive gas into an "airspace" between the wafer and the hotplate. A "non-reactive" gas is a gas that does not readily react with the chemical coating of the wafer during the curing process. Helium is a particularly good thermally conductive, nonreactive gas and is both readily available and inexpensive. Helium in the airspace between the wafer and the hotplate produces a much more uniform heating of the wafer than the proximity bake systems of prior art photolithography systems, reducing any anomalies in the heating of the wafer near points in contact with the support posts and transferring heat to areas of the wafer that are of increased distance from the hotplate as a result of a warp in the wafer. Furthermore, as helium is a particularly efficient energy transfer medium, the time required to heat the wafer to the desired temperature, as well as the time required to cool the wafer, is reduced by two-thirds or more.

In one embodiment, helium is heated to the desired temperature, e.g., 100° C., prior to introduction into the airspace between the wafer and the hotplate. In a particular embodiment, this preheating of the helium is accomplished by forcing the helium through a bore that passes through the hotplate.

BRIEF DESCRIPTION OF THE DRAWINGS

FIGS. 11A and 11B are cross-sectional views of a hotplate formed in accordance with the fourth described embodiment of the present invention.

DETAILED DESCRIPTION

The present invention is described in terms of a semiconductor wafer photolithography system, but has wide applicability to any type of substrate photolithography system (e.g., photolithography systems for flat-pannel-display glass substrates).

Figure 1:
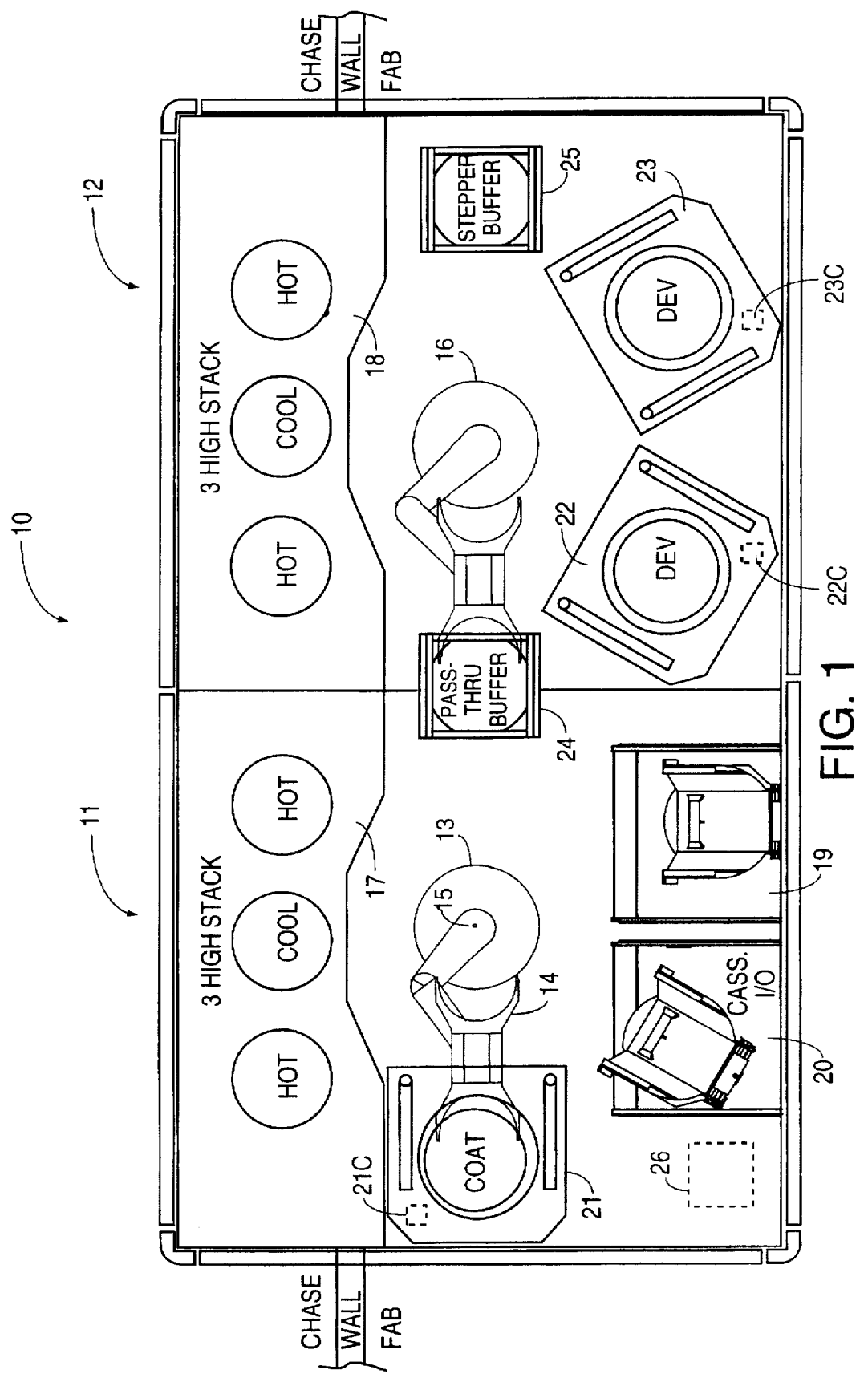
FIG. 1 illustrates a plan view of a clustered semiconductor wafer photolithography system in accordance with the invention.

FIG. 1 illustrates a plan view of a semiconductor wafer photolithography system 10 in accordance with the invention. System 10 includes a wafer coating section 11 and a wafer developing section 12. At the center of coating section 11 is a wafer handling robot 13. Robot 13, which may be the model ATM 100 manufactured by Equipe Technologies of Mountain View, Calif., is a three-degree-of-freedom robot with the ability to place wafers anywhere in a cylindrical coordinate system. It has an end effector 14 that is capable of handling two wafers simultaneously. It pivots about an axis 15 approximately at the center of coating section 11. A similar robot 16 is positioned at the center of developing section 12. In such a design, the robot arm is never required to pass over a heated surface. This reduces the possibility of heat tranferance to the robot arm. However, such a design can only operate at maximum efficiency when the cool process requires less than one-half of the time needed during bake processes. Because there are twice as many ovens as chillplates, cooling efficiency must be high for maximum system efficiency.

Figure 2:
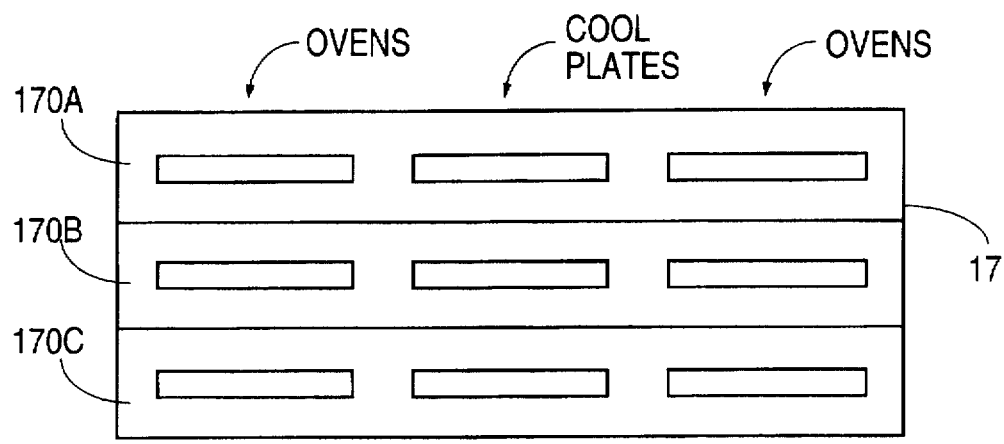
FIG. 2 illustrates a front elevational view of the heating/cooling unit.

Clustered about robots 13 and 16 are a series of processing modules. In coating section 11, a heating/cooling unit 17 contains modules 170A, 170B and 170C stacked three high. FIG. 2 illustrates an elevational view of heating/cooling unit 17. As shown in FIGS. 1 and 2, modules 170A–170C each contain a central chillplate located between two ovens. Modules 170A–170C may each be of the kind described in the aforementioned application entitled "Thermal Process Module For Substrate Coat/Develop System." A similar heating/cooling unit 18 is positioned in developing section 12.

Figure 3:
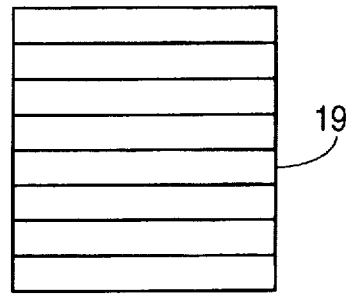
FIG. 3 illustrates a front elevational view of the wafer cassette.

Coating section 11 contains cassette input/output (I/O) units 19 and 20. Each cassette I/O unit holds a cassette containing a plurality of wafers, as shown in the elevational view of FIG. 3, and provides a means by which wafers are introduced into and withdrawn from photolithography system 10. Cassette I/O units 19 and 20 can be moved between a retracted position (see unit 19) to an operating position (see unit 20), in the latter of which the cassette faces the axis of robot 13. Both units are accessed from the front of system 10. Cassette I/O units 19 and 20 may each be of the kind described in the aforementioned application entitled "Cassette Input/Output Unit For Semiconductor Processing System." Coating section 11 contains a spin coating unit 21, and developing section 12 contains two developing units 22 and 23. A central wafer pass-through buffer 24 is provided for transferring the wafers between coating section 11 and developing section 12, and an optional stepper buffer 25 may be provided for passing the wafers to an adjacent exposure system (not shown).

The components of photolithography system 10 are controlled by a main system controller 26. Heating/cooling modules 170A–170C have individual microcontrollers (not shown). Similarly, coating unit 21 has a microcontroller 21C and developing units 22 and 23 have microcontrollers 22C and 23C, respectively. Each of these microcontrollers is connected to the system controller 26 in a master-slave relationship, and they perform such functions as actuating air cylinders, controlling motors, monitoring sensors, dispensing chemicals. The system controller 26 issues high-level commands to and receives high-level status information from the individual microcontrollers.

The manner of operation of system 10 depends on the particular processing sequence used and will be apparent to those skilled in the art. For example, robot 13 may initially take a wafer from cassette I/O unit 19 and transfer it to an oven in module 170A for the initial dehydration heating. When the dehydration heating is completed, the microcontroller in module 170A instructs controller 26, and robot 13 transfers the wafer from the oven to the chillplate of module 170A. When the cooling process is completed, controller 26 is again instructed, and robot 13 transfers the wafer to spin coating unit 21 where the photoresist is applied. Robot 13 then transfers the wafer from spin coating unit 21 back to an oven in heating/cooling unit 17 for a soft bake and to a chillplate for cooling.

After the coating process is completed and the wafer has been soft baked and cooled, robot 13 transfers the wafer to pass-through buffer 24, where robot 16 takes over. Robot 16 delivers the wafer to stepper buffer 25 for transfer to an external exposure unit, back to an oven in heating/cooling unit 18 for the post-exposure bake, and then to a chillplate in unit 18. This takes place under the control of a microcontroller in unit 18 and system controller 26. When the wafer has been properly cooled, it is transferred to one of developing units 22 or 23. After it has been developed, the wafer is transferred back to an oven in heating/cooling unit 18 for the "hard" bake, and then to a chillplate in heating/cooling unit 18. After the wafer has been cooled, it can be transferred via pass-through buffer 24 and robot 13 to one of cassette I/O units 19 or 20.

Figure 4:
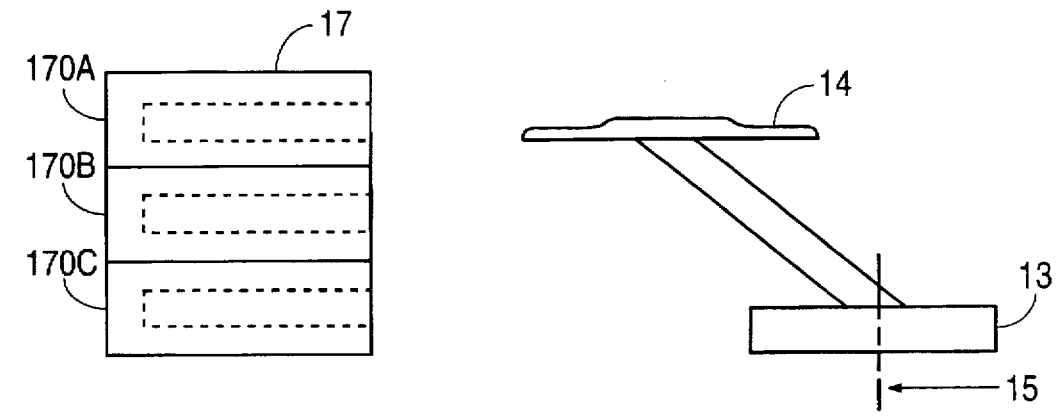
FIG. 4 illustrates a side elevational view of the heating/cooling unit and the robot.

What has been described is a very compact, cost-efficient system for coating and developing wafers. Robots 13 and 16 are three-degree-of-freedom robots instead of the relatively complex six-degree-of-freedom robots that have been used in some prior art systems. As shown in the side elevational view of FIG. 4, robot 13 can deliver or retrieve a wafer to or from the cooling section of any of the stacked modules 170A–170C in heating/cooling unit 17. Robot 16 can likewise access any of the modules in heating/cooling unit 18. The amount of "dead space" surrounding robots 13 and 16 is kept to a minimum, and the space occupied by the heating and cooling modules is likewise minimized by stacking them. In fact, one embodiment of system 10 has a total footprint of only 29.5 square feet.

Figure 5A:
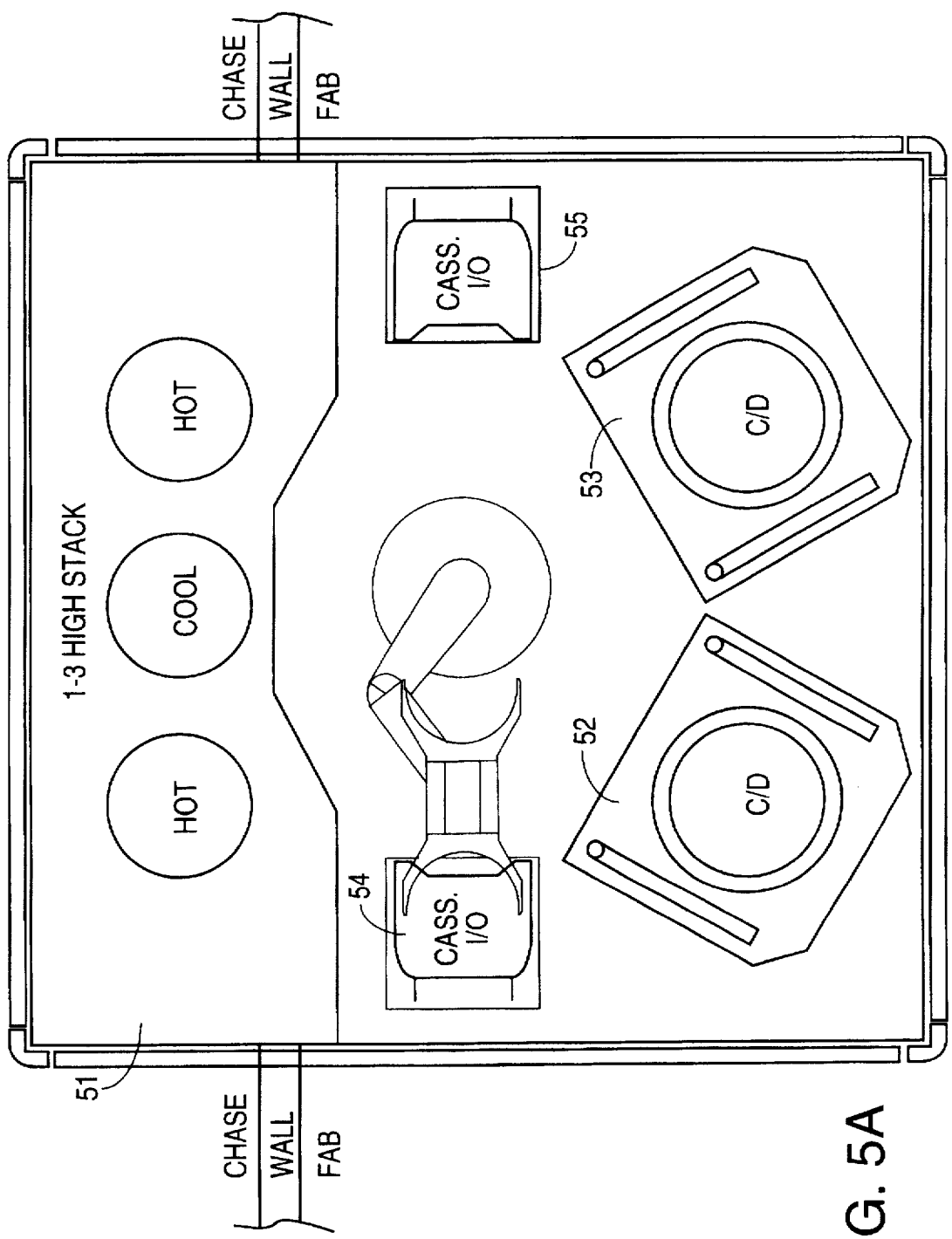
FIGS. 5A-5D illustrate plan views of alternative embodiments in accordance with the invention.
Figure 5B:
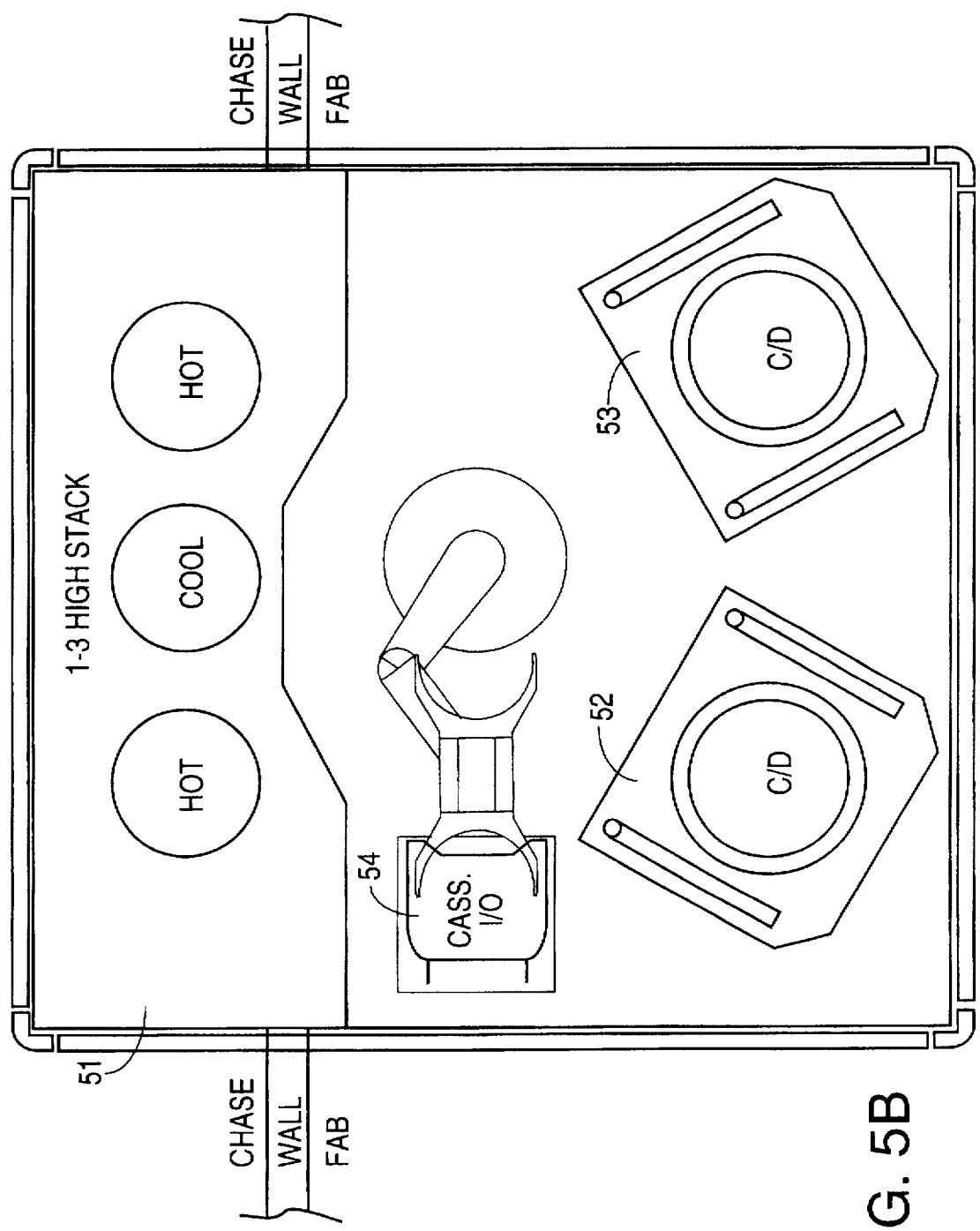
Figure 5C:
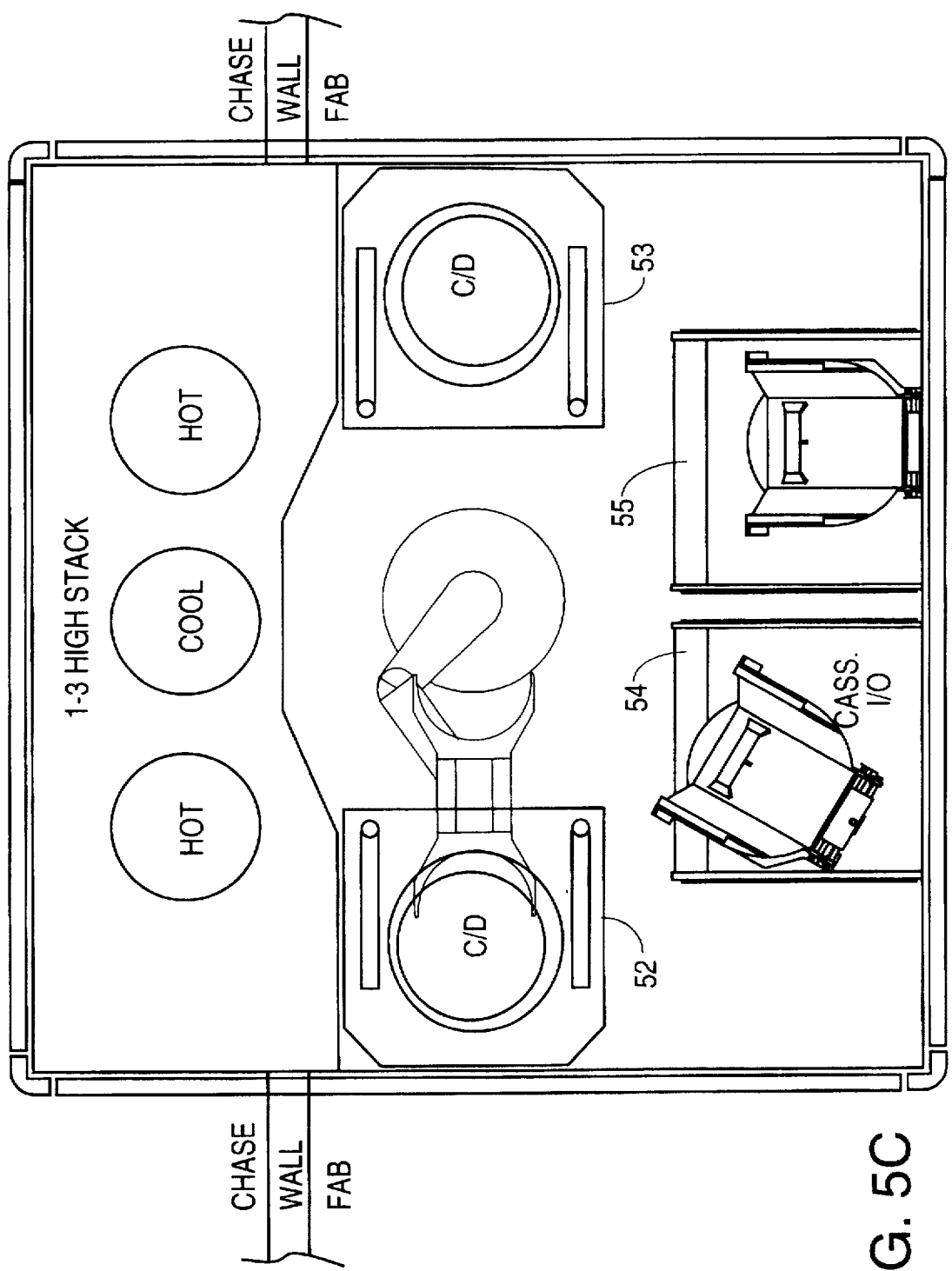
Figure 5D:
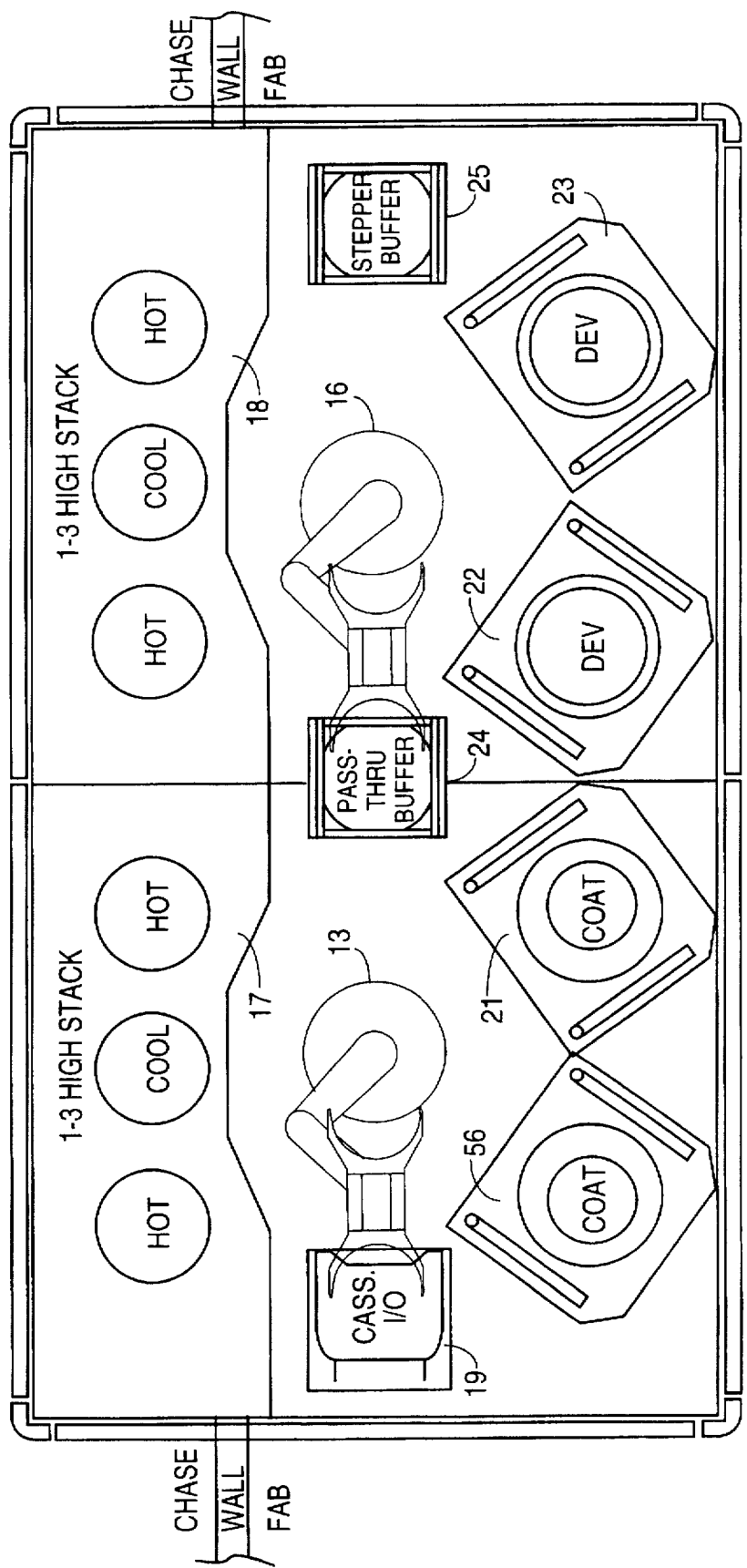

Many alternative embodiments are possible within the broad principles of the present invention. Several of these alternative embodiments are illustrated in FIGS. 5A–5D. FIG. 5A illustrates a photolithography system with a single heating/cooling unit 51 and units 52 and 53, which can be either coaters or developers. In the preferred model of this embodiment, heating/cooling unit 51 includes only a single module (similar to module 170C). A pair of cassette I/O units 54 and 55 are also included. The footprint of this embodiment may be as little as 17.1 square feet. FIG. 5B illustrates a system similar to that shown in FIG. 5A except that cassette I/O unit 55 is omitted. The footprint may be as little as 15.2 square feet. FIG. 5C illustrates a system with the same components as FIG. 5A, except that the cassette I/O units 54 and 55 are positioned for front access to the system, while coater/developer units 52 and 53 are positioned on the sides. The footprint may be as little as 17.1 square feet. FIG. 5D illustrates a system similar to system 10 shown in FIG. 1, except that cassette I/O unit 20 has been replaced by a second spin coating unit 56. The footprint may be as low as 29.5 square feet.

Figure 6:
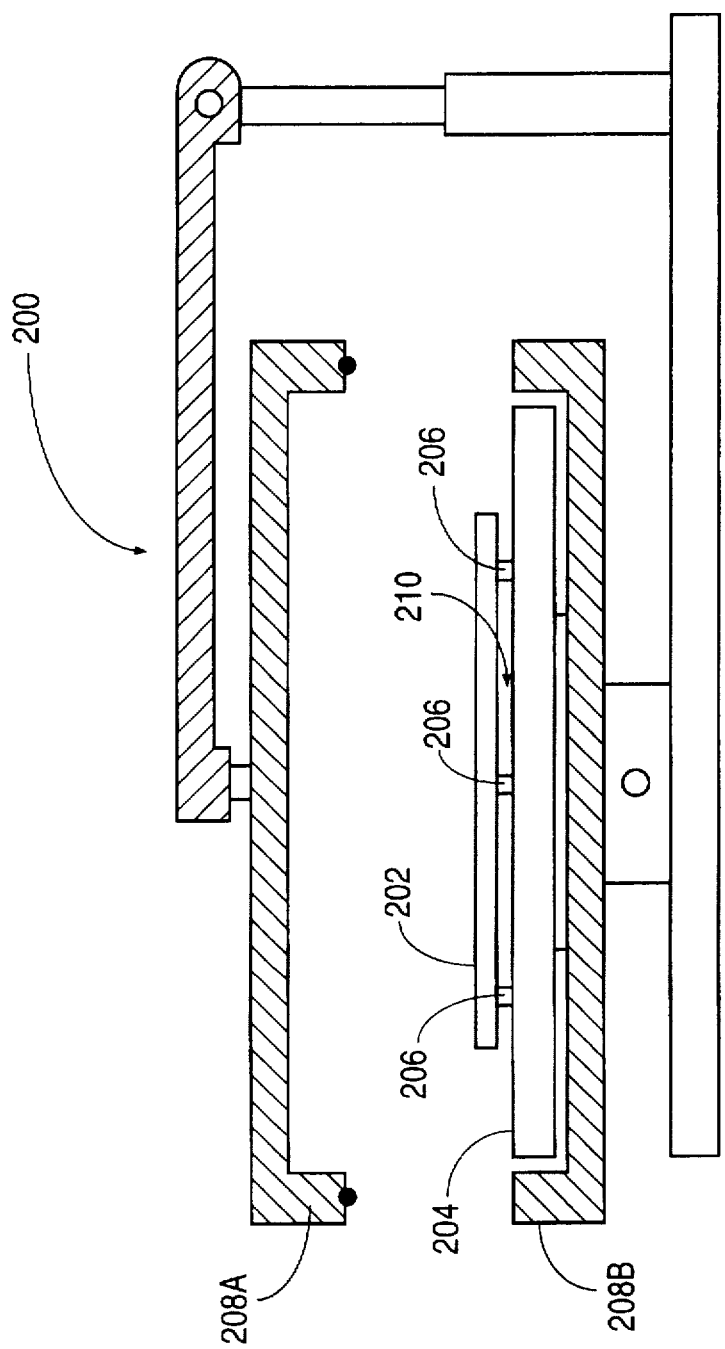
FIG. 6 is a cross-sectional view of a proximity bake system in accordance with the present invention.

FIG. 6 shows a hot plate assembly 200. Hotplate assembly 100 may be used, with some modifications discussed below, to provide wafer heating in modules 170A, 170B and 170C of FIG. 2. The following description of hot plate assembly 200 is equally applicable to the chillplates in modules 170A, 170B and 170C of FIG. 2.

In FIG. 6, a wafer 202 is spaced from a hotplate 204 by about 5 mils by support posts 206. As is commonly done in the art, hotplate 204 is heated to 100° C. To facilitate heat transfer from hotplate 204 to wafer 202, helium gas is introduced into an "airspace" 210 between wafer 202 and hotplate 204.

While helium is used in disclosed embodiment, any gas may be used so long as the gas is particularly efficient as an energy transfer medium and will not react with the chemical coating on wafer 202. A gas is particularly efficient as an energy transfer medium if the gas has a thermal conductivity that is approximately equal to or greater than 100 cal/(sec)(cm$^2$) (°C./cm)×10$^{-6}$ at a temperature of 100° F. (i.e., 37.8° C.). Such a gas is called herein a "thermally conductive gas."

Helium is a particularly efficient energy transfer medium as helium has a thermal conductivity of 368.63 cal/(sec) (cm²) (°C./cm)×10⁻⁶ at a temperature of 100° F. (Air, in contrast, has a thermal conductivity of only 64.22 cal/(sec) (cm²) (°C./cm)×10⁻⁶ at a temperature of 100° F.) Furthermore, as helium is an inert gas, helium will not react with any chemical coating on wafer 202. A gas that will not readily react with the chemical coating of wafer 202 is herein called a "non-reactive gas." Additionally, helium is readily available and inexpensive.

Some thermally conductive gases are listed in Table A below.

TABLE A

| Gas | Thermal Conductivity[1] |
| --- | --- |
| Helium | 368.63 |
| Hydrogen | 458.72 |
| Deuterium | 343.01 |
| Neon | 118.19 |
| Air | 64.22 |

[1]As above, the thermal conductivity is listed in units of cal/(sec) (cm²) (°C./cm) × 10⁻⁶ for a temperature of 100° F. (37.8° C.).

As helium has a particularly high thermal conductivity, the helium gas in airspace 210 between hotplate 204 and wafer 202 serves as a particularly efficient energy transfer medium between hotplate 204 and wafer 202. As a result, in one embodiment of the present invention the time required to bring wafer 202 from room temperature to 100° C. is reduced from forty-five (45) seconds without helium in airspace 210 to thirteen (13) seconds with helium in airspace 210. A similar reduction is observed in the time required for the wafer to cool when in proximity to a chillplate (not shown). Thus, as many as three times the number of wafers can be processed according to the disclosed embodiment of the present invention as can be processed with prior proximity bake systems.

The industry practice has generally been to provide an equal number of hotplates and chillplates in a processing module. Using the principles of this invention, however, the time required to cool a wafer can be reduced to less than one-half the required bake time (typically about one minute). Thus, a ratio of one chillplate for every two hotplates is possible, significantly reducing the dimensions of the processing module.

Furthermore, as helium is a particularly efficient energy transfer medium, helium in airspace 210 produces a much more uniform heating of wafer 202 than did proximity bake systems of the prior art. Helium in airspace 210 reduces any anomalies in the uniform heating of wafer 202 near points in contact with support posts 206. In addition, helium gas generally rises, thereby naturally flowing to areas of wafer 202 that are of increased distance from hotplate 204 as a result of a warp in wafer 202. These areas of wafer 202 that were typically insufficiently heated in previously known proximity bake systems are sufficiently and efficiently heated by the heat transfer properties of the helium. Thus, helium in airspace 210 provides a substantial improvement over the known bake systems in the uniformity and efficiency of the heating of wafer 202.

In one embodiment, while wafer 202 is baking in proximity to hotplate 204, a lid 208A is lowered so as to form a sealed chamber with a support structure 208B, thereby containing the helium gas and the heat of hotplate 204. In the embodiment of FIG. 2, lid 208A and support structure 108B are not necessary, as hotplate 204 is located inside modules 170A, 170B, and 170C.

Figure 7:
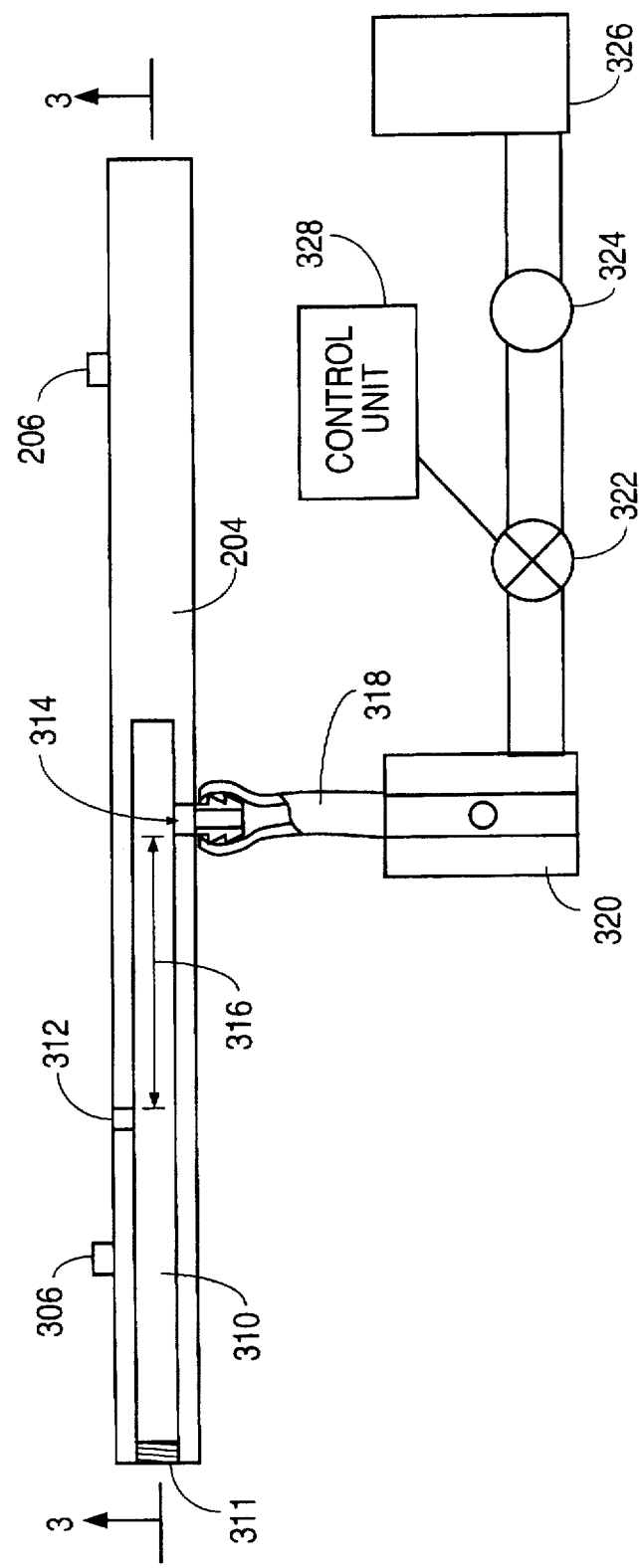
FIG. 7 is a cross-sectional view of a hotplate and a schematic view of a helium supply in accordance with one embodiment of the present invention.
Figure 8:
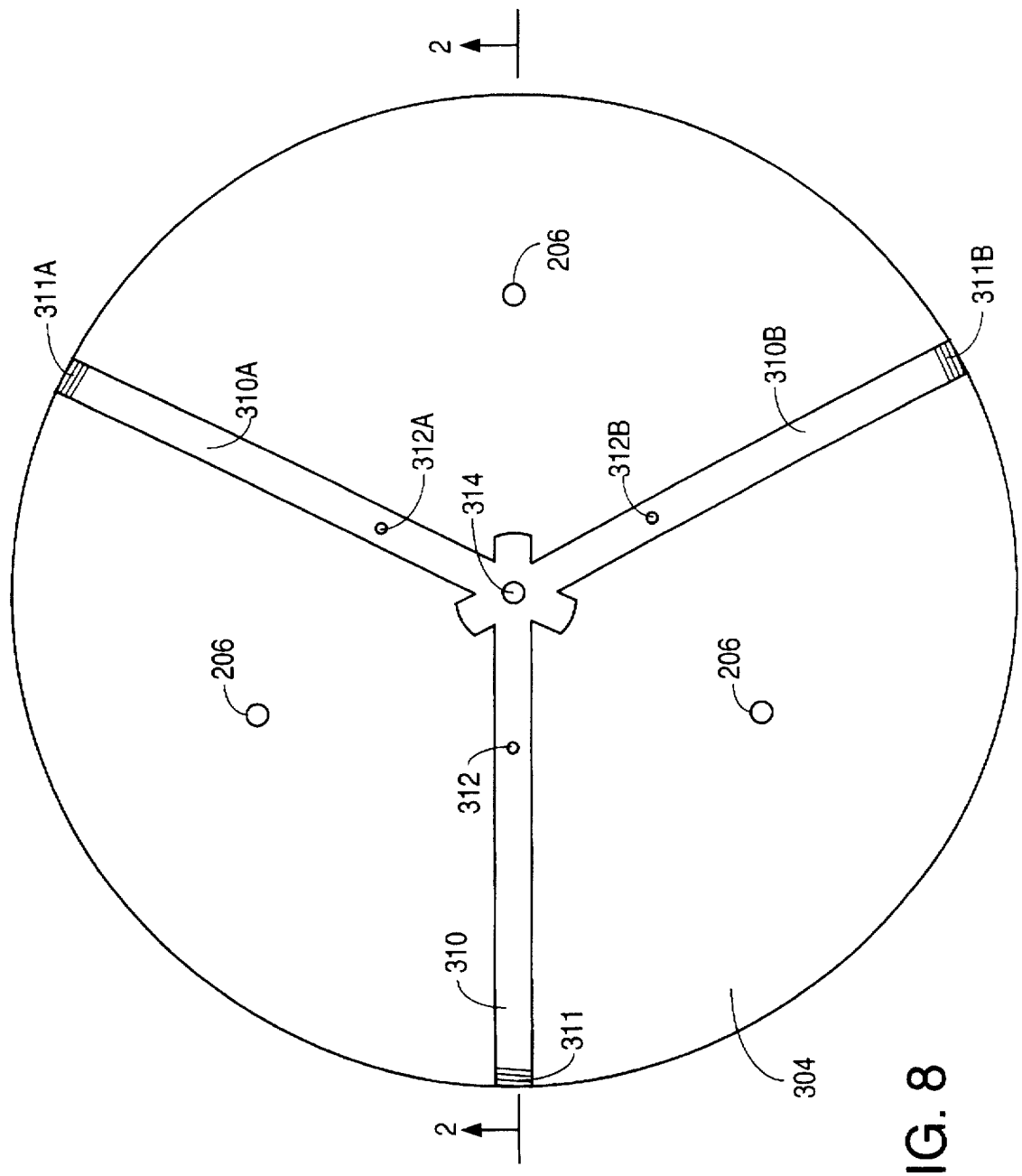
FIG. 8 is a plan view of the hotplate of FIG. 7.

Hotplate 204 is shown in greater detail in FIGS. 7 and 8. Hotplate 204 is gun drilled from the edge of hotplate 204 through its center to form a radial bore 310. Similarly, radial bores 310A and 310B (FIG. 8) are drilled. Plugs 311, 311A, and 311B seal the ends of radial bores 310, 310A, and 310B, respectively. A center bore 314 is drilled through the bottom of hotplate 204 so as to allow helium to be introduced into radial bores 310, 310A and 310B. A top bore 312 (FIG. 7) is drilled through the top of hotplate 204 into radial bore 310. Top bore 312 is spaced from center bore 314 by a distance 316, such that helium introduced through center bore 314 travels along radial bore 310 for a distance of at least distance 316. As helium flows from center bore 314 along distance 316 of radial bore 310 to top bore 312, the helium is heated to the temperature of hotplate 204. Thus, helium flowing through top bore 312 into airspace 210 (FIG. 6) is the same temperature as that of hotplate 204.

In one embodiment, distance 316 (FIG. 7) is at least 2 inches and the diameter of top bore 312 is 2 mils. Top bores 312A and 312B (FIG. 8) are drilled through the top of hotplate 204 into radial bores 310A and 310B, respectively, in the manner described above with respect to top bore 312.

In another embodiment, an additional top bore (not shown) is drilled directly over center bore 314. Helium flowing through this center top bore is not as thoroughly preheated as is helium flowing through top bores 312, 312A and 312B.

Some hotplates used in the prior art applied a vacuum hold-down using radial bores, top bores and a center bore that were drilled as described above with respect radial bores 310, 310A, and 310B; top bores 312, 312A, and 312B; and center bore 314. In such hotplates, helium is introduced through the bores to which a vacuum was applied in the prior art. In hotplates having numerous top bores, helium may flow through only one or a few of the top bores, causing wafer 202 to be heated non-uniformly. It is preferred that a sufficient number of the top bores of such a hotplate be plugged such that helium flows through top bores that are sufficiently distributed to uniformly fill airspace 210 with helium.

Helium is introduced into hotplate 204 from a helium source 326 (FIG. 7). Helium source 326 can be an ordinary bottle of pressurized helium available from Airco Products of San Leandro, Calif. A valve 324 controls the rate at which helium flows from helium source 326. In one embodiment, valve 324 is adjusted by hand to provide a flow rate just sufficient to prevent forming an air bearing under wafer 202 as described below. It is appreciated that known and available electronically controlled valves can be used in as valve 324. The flow of helium from helium source 326 is controlled by a solenoid valve 322 and the rate at which helium flows from helium source 326 is monitored by flow meter 320. Helium flows from helium source 326 through valve 324, solenoid valve 322, flow meter 320, and a tube 318 through center bore 314 into radial bores 310, 310A and 310B of hotplate 204. In one embodiment, solenoid valve 322 is controlled by a control unit 328.

Solenoid valve 322, in one embodiment, is the EVO-3-12DVC solenoid valve supplied by Clippard Laboratories of Cincinnati, Ohio. Flow meter 320 can be the B-433 flow meter available from the Porter Instrument Company of Hatfield, Pa. The B-433 flow meter can measure flow rates ranging from zero (0) to thirty-two (32) cubic centimeters per minute (cc/min). The B-433 flow meter is not designed for use with helium and some helium leaks from the B-433 flow meter when used as flow meter 320. However, many conventional flow meters are designed for use with helium and can be used as flow meter 320.

The use of control unit 328 to control solenoid valve 322 is known and a control unit capable of controlling solenoid valve is used in the Orbitrack system available from Semiconductor Systems, Inc. of Fremont, Calif.

In one embodiment, helium flows from helium source 326 at a rate of about 3 cc/minute. In this embodiment, helium flows at a rate just below a rate that forms an air bearing below wafer 202. The appropriate flow rate is determined by increasing the flow rate of helium until an "air" bearing forms under wafer 202 (typically 2–4 cc/minute), causing wafer 202 to move with respect to hotplate 204. The flow rate of the helium is then decreased until wafer 202 settles on support posts 206.

Areas of the chemical coating of wafer 202 that are directly above top bores 312, 312A and 312B (FIG. 8) tend to cure more quickly than other areas of the chemical coating of wafer 202. Thus, in other embodiments, helium is pulsed into airspace 210 by repeatedly turning on the flow of helium for a period of time and then turning off the flow of helium for a period of time. By periodically stopping the flow of helium into airspace 210, the helium is allowed to disperse throughout airspace 210 to provide a more even heating of wafer 202. In one embodiment, helium is introduced into airspace 210 at a rate of fifteen (15) to twenty (20) cc/minute for a period of two seconds and then shut off for a period of two seconds. In some embodiments, helium is introduced through top bores 312, 312A and 312B prior to placing wafer 202 support posts 206. This early introduction of helium speeds the heating of wafer 202 and minimizes any premature, non-uniform heating of wafer 202 as a result of being placed in contact with support posts 206, which may be hot as a result of a previous bake.

Figure 9A:
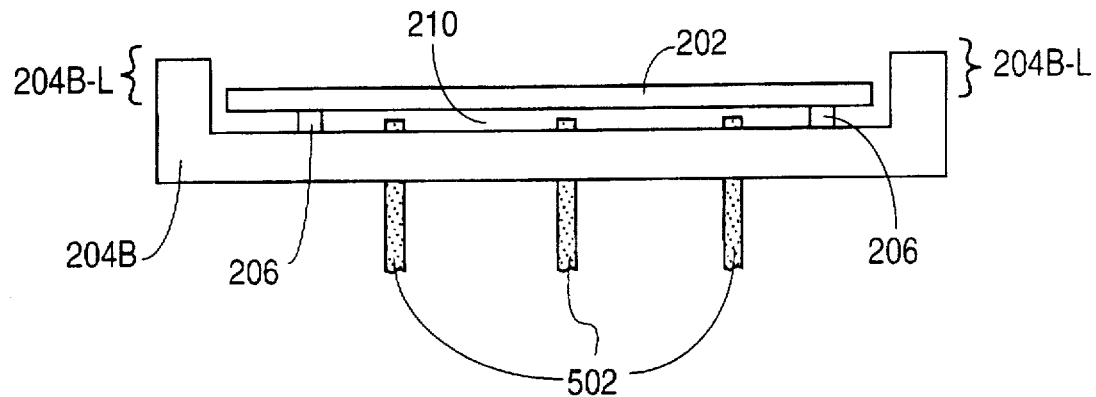
FIGS. 9A and 9B are cross-sectional views of a hotplate formed in accordance with the second described embodiment of the present invention.
Figure 9B:
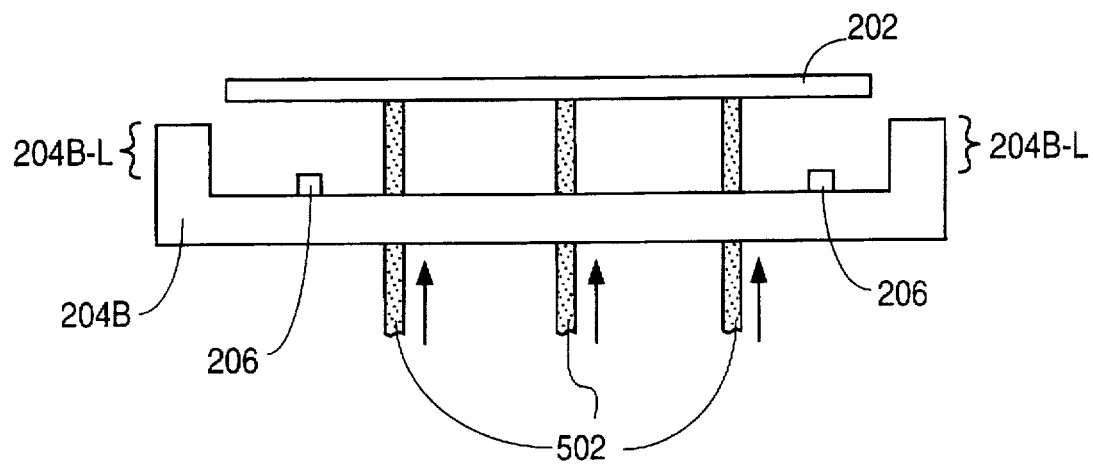

Another embodiment of a hotplate according to the principles of the present invention is shown in FIGS. 9A and 9B. Hotplate 204B has a lip 204B-L around the periphery of wafer 202 to form a well or bowl in which wafer 202 sits. Lip 204B-L reduces the leakage of helium from airspace 210 between wafer 202 and hotplate 204B. Wafer 202 (FIG. 9B) is lifted above lip 204B-L after the proximity bake by lift pins 502, which are positioned in holes (not shown) through hotplate 204B, and which are slidably moveable in the vertical direction. Such lift pins are commonly used in proximity bake systems currently available, e.g., the Orbitrack system available from Semiconductor Systems, Inc. of Fremont, Calif. Similarly, wafer 202 is lowered below lip 204B-L into the position shown in FIG. 9A prior to the proximity bake by lift pins 502.

Figure 10:
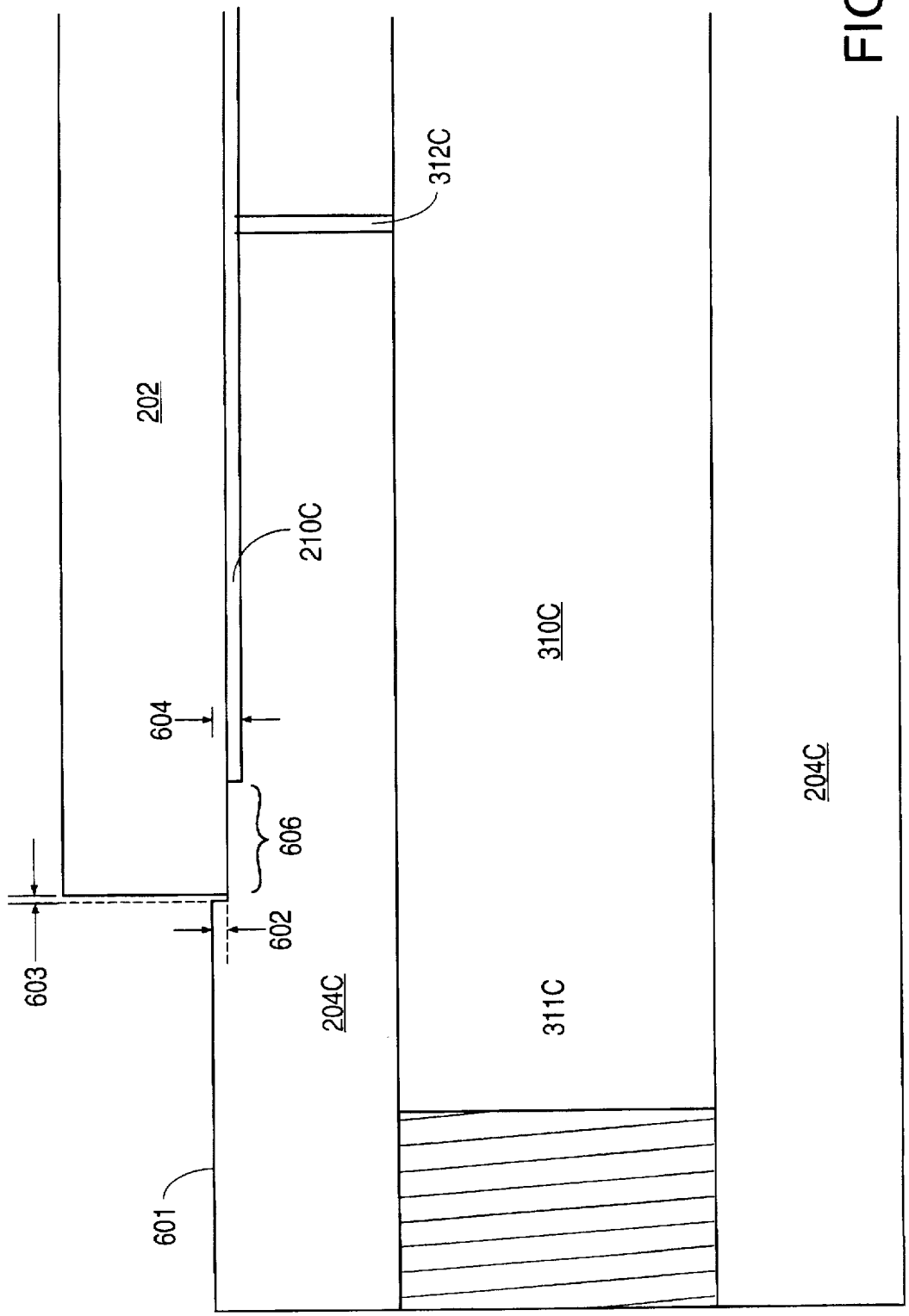
FIG. 10 is a cross-sectional view of a hotplate formed in accordance with the third described embodiment of the present invention.

FIG. 10 shows another embodiment of a hotplate in accordance with the principles of the present invention. Radial bore 310C, top bore 312C, and plug 311C of hotplate 204C are formed generally as described above with respect to FIG. 7. The top surface 601 of hotplate 204C is milled to a depth 602 such that wafer 202 will sit in the milled area with a gap of a distance 603 around the perimeter of wafer 202 and the unmilled portion of surface 601. In one embodiment, depth 602 is 5 mils and distance 603 is ten (10) mils. Hotplate 204C is again milled to a depth 604 so as to leave a bench 606 to support wafer 202 and leave an airspace 210C between hotplate 204C and wafer 202. In one embodiment, bench 606 has a width of one-tenth of an inch, and depth 604 is 10 mils so as to leave a distance of 5 mils between wafer 202 and hotplate 204C. As described above with respect to hotplate 204B (FIGS. 9A and 9B), lift pins (not shown in FIG. 10) lift wafer 202 (FIG. 10) out of and lower wafer 202 into the milled area of hotplate 204C.

Figure 11C:
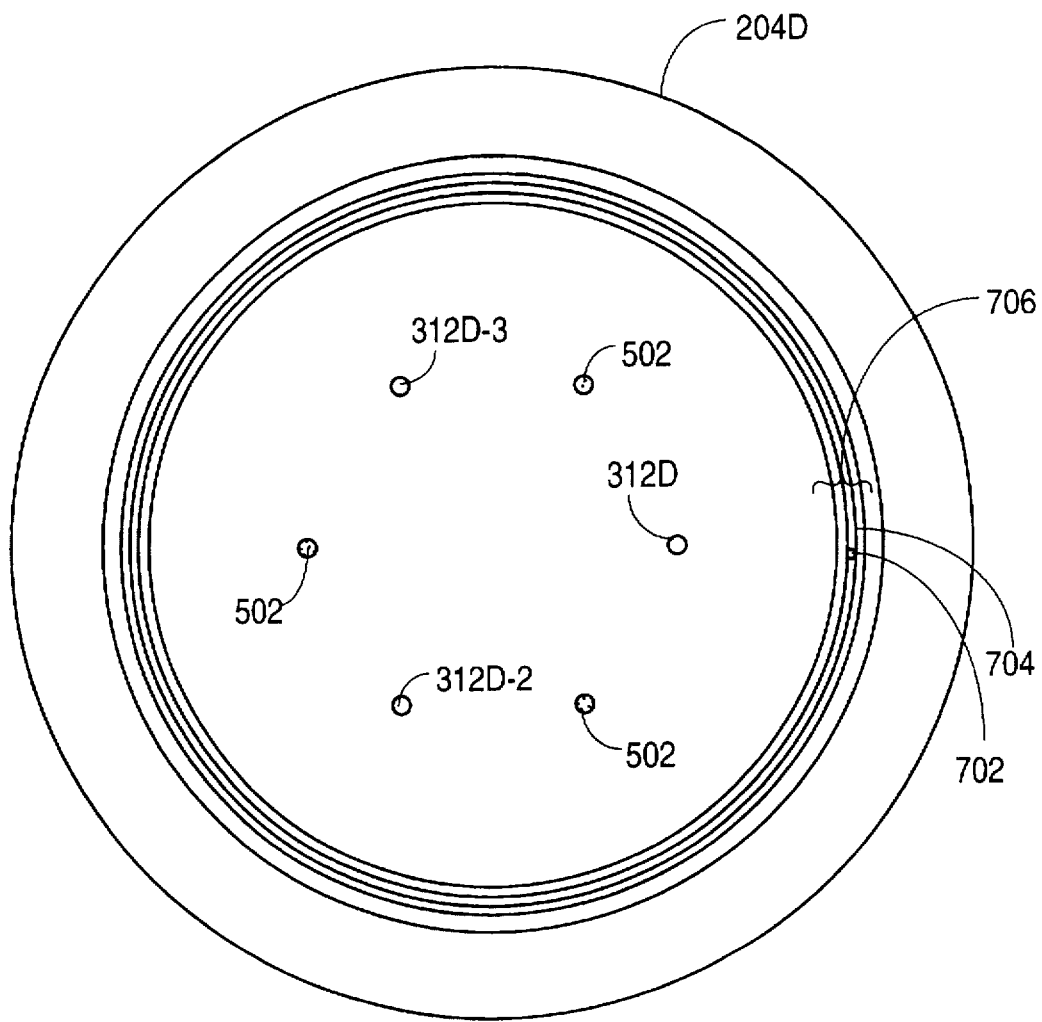
FIG. 11C is a plan view of the hotplate of FIGS. 11A and 11B.

A fourth embodiment of a hotplate according to the principles of the present invention is shown in FIGS. 11A–11C. Hotplate 204D has no gun-drilled radial bores but instead has a cylindrical chamber 310D that is formed inside and is concentric with hotplate 204D. Helium is introduced into chamber 310D through center bore 314D. Top bore 312D is angled toward the center of hotplate 204D. Wafer 202 sits on a bench 706 that is formed as described above with respect to bench 606 (FIG. 10). In bench 706 (FIG. 11A), an annular groove 704 is formed. A vacuum bore 702 is drilled through hotplate 204D into annular groove 704. A relative vacuum is applied to reduce the air pressure in annular groove 704 through vacuum bore 702 to hold wafer 202 tightly against bench 706 of hotplate 204D.

As is the case with hotplate 204C (FIG. 10), hotplate 204D (FIG. 11B) is milled to a depth 750 of 5 mils and is further milled to a depth 752 of an additional 5 mils to form bench 706 whose inner edge is a distance 754 of one-tenth (0.1) of an inch from outer edge 768 of the well. Hotplate 204D is further milled in a area 770 between the inner edge of bench 706 and the outer edge 768 of the well. Annular groove 704 is placed in the center of bench 706 leaving a narrow portion of the surface of bench 706 of a width 756 of approximately thirty (30) mils on either side of annular groove 704. If distance 756 is excessively narrow, hotplate 204D becomes susceptible to physical damage and wear. Annular groove 704 has a width 764 of approximately sixty (60) mils.

Milling hotplate 204D between bench 706 and outer edge 768, i.e., in area 770, reduces backside contact with wafer 202 at the outer most edge of wafer 202. It is important that bench 706 be positioned some distance from the outer edge of wafer 202 because backside contamination of wafer 202 at the position of contact near annular groove 704 can reduce the effectiveness of vacuum hold-down and backside contamination is most likely at the outer edge of wafer 202. Wafer 202 is lifted on to and off of bench 706 by lift pins 502 (FIGS 11A and 1C) as described above with respect to FIGS. 9A and 9B.

Top bore 312D is drilled at a position that is a distance 758 of approximately 1 centimeter or 0.39 inches from bench 706. Top bore 312D is drilled at an angle 760 of approximately 45° from perpendicular to the surface of hotplate 204D. Top bore 312D is angled toward the center of hotplate 204D. The diameter 762 of top bore 312D is approximately 2 mils.

FIG. 11C is a top view of hotplate 204D. Annular groove 704 in bench 706 is shown with vacuum bore 702. A total of three top bores, i.e., top bores 312D, 312D-2, and 312D-3, are angled toward the center of hotplate 204D. A wafer is automatically centered on bench 706 by alternatively (i) filling airspace 210D (FIG. 11A) with sufficient helium to lift wafer 202 from bench 706 and (ii) applying a relative vacuum to vacuum bore 702 to firmly hold wafer 202 against bench 706. The sequence of lifting and then firmly holding wafer 202 is repeated five (5) times to ensure that wafer 202 is centered on bench 706.

Because annular groove 704 (FIG. 11C) applies a relative vacuum to wafer 202 (not shown in FIG. 1C) around the entire periphery of wafer 202, any small warp in wafer 202 is reduced or eliminated during the baking process. Additionally, back-side contamination near the center of wafer 202 is eliminated as no support posts are used. Such a configuration is advantageous because wafers generally yield more good devices near their center than near their periphery, making it more important to eliminate back-side contamination near the center of a wafer than near the periphery. Despite the desirability of eliminating support posts, larger wafers, such as large, flat panels for flat-panel displays, may require a support post (not shown) in the center of hotplate 204D to prevent warping of and to support wafer 202.

The principles of the present disclosure are equally applicable to improving the cooling of semiconductor wafers immediately subsequent to baking. For example, hotplate 204D (FIG. 11A) can be used as a chillplate. To use hotplate 204D as a chillplate, hotplate 204D is kept at room temperature. Wafer 202 is placed on hotplate 204D and centered as described above. Wafer 202 is held in place by a relative vacuum applied to annular groove 704 through vacuum bore 702. A thermally conductive, non-reactive gas, such as helium, is introduced through center bore 314D, through chamber 310D, and through top bore 312D into airspace 210D. Helium in airspace 210D accelerates the transfer of heat from wafer 202 to hotplate 204D. Thus, a thermally conductive gas between wafer 202 and hotplate 204D promotes heat exchange between wafer 202 and hotplate 204D both during heating and during cooling.

The above description is illustrative and not limiting. For instance, the modules in the heating/cooling units may be stacked more or less than three-high. Other modifications will be apparent to those of ordinary skill in the art in light of this disclosure and are intended to fall within the scope of the appended claims.

We claim:

1. A method of providing a cured layer of photoresist on a surface of a semiconductor substrate, the method comprising the steps of;

placing the substrate in a first hotplate assembly, wherein the first hotplate assembly includes a first hotplate having a first support for supporting the substrate in proximity to the first hotplate so as to create a first space between the substrate and the hotplate;

heating the first hotplate of said first hotplate assembly using a heating element;

introducing a thermally conductive gas between the substrate and the heated first hotplate to increase the rate of heat transfer between the heated first hotplate and the substrate;

baking the substrate to remove moisture from the surface;

transferring the substrate from the first hotplate assembly to a chillplate assembly, wherein the chillplate assembly includes a chillplate having a support for supporting the substrate in proximity to the chillplate so as to create a space between the substrate and the chillplate;

introducing a thermally conductive gas between the substrate and the chillplate to increase the rate of heat transfer between the substrate and the chillplate;

cooling the substrate to prepare the surface for the layer of photoresist;

transferring the substrate to a coating unit;

applying the layer of photoresist over the surface;

transferring the coated substrate from the coating unit to a second hotplate assembly, wherein the second hotplate assembly includes a second hotplate having a second support for supporting the coated substrate in proximity to the second hotplate so as to create a second space between the coated substrate and the second hotplate;

heating the hotplate of said second hotplate assembly using a heating element;

introducing a thermally conductive gas between the coated substrate and the heated second hotplate to increase the rate of heat transfer between the heated second hotplate and the coated substrate; and baking the coated substrate.

2. The method of claim 1, wherein first and second hotplate assemblies are a single hotplate assembly.

3. A method of providing a cured layer of photoresist on a surface of a semiconductor substrate, the method comprising the steps of:

coating the substrate with uncured photoresist in a photoresist coating unit;

transferring the coated substrate from the photoresist coating unit to a hotplate assembly, wherein the hotplate assembly includes a hotplate having a support for supporting the substrate in proximity to the hotplate so as to create a space between the substrate and the hotplate;

heating the hotplate of said hotplate assembly using a heating element; and introducing a thermally conductive gas between the substrate and the heated hotplate to increase the rate of heat transfer between the heated hotplate and the substrate.

4. The method of claim 3, wherein the thermally conductive gas is helium.

5. The method of claim 3, further comprising the step of preheating the gas before the step of introducing.

6. The method of claim 3, further comprising the steps of alternately (1) filling the space between the substrate and the hotplate with enough of the gas to lift the substrate, and (2) applying a vacuum to a back surface of the substrate, thereby firmly holding the substrate.

7. The method of claim 3, wherein the hotplate assembly heats the substrate to approximately 100° C.

8. A method of providing a cured layer of photoresist on a surface of a semiconductor substrate, the method comprising the steps of;

coating the substrate with a layer of uncured photoresist;

after the step of coating, positioning the substrate in proximity to a hotplate of a hotplate assembly, wherein there is a space between the substrate and the hotplate;

heating the hotplate of said hotplate assembly using a heating element; and after the step of positioning, introducing a thermally conductive gas between the substrate and the heated hotplate to increase the rate of heat transfer between the heated hotplate and the substrate.

9. The method of claim 8, wherein the thermally conductive gas has a thermal conductivity that is approximately equal to or greater than $100 \text{ cal}/(\text{sec})(\text{cm}^2)(°\text{C.}/\text{cm}) \times 10^{-6}$ at a temperature of 37.8° C.

10. The method of claim 9 wherein the thermally conductive gas is a gas which does not readily react with the layer of uncured photoresist.

11. The method of claim 10 wherein the gas comprises helium.

12. The method of claim 8 further comprising baking the substrate so that the layer of uncured photoresist is cured.

13. The method of claim 12, wherein the step of baking is performed for a first time period, said method comprising after the baking step, cooling the substrate for a second time period, wherein the second time period is less than one half of the first time period.

14. A method of claim 8, further comprising the step of preheating the gas before the step of introducing.

15. The method of claim 8, further comprising the steps of alternately (1) filling the space between the substrate and the hotplate with enough of the gas to lift the substrate, and (2) applying a vacuum to a back surface of the substrate, thereby firmly holding the substrate against a bench.

16. The method of claim 8, wherein the step of introducing a thermally conductive gas between the substrate and the heated hotplate results in heating the substrate to approximately 100° C.

* * * * *